United States Patent [19]

Flowers et al.

[11] 3,904,784

[45] Sept. 9, 1975

[54] SEMICONDUCTOR WAFER CORROSION PROTECTION AND SOLUTION THEREFOR

[75] Inventors: Dervin L. Flowers, Scottsdale; V. Louise Rice, Phoenix, both of Ariz.

[73] Assignee: Motorola, Inc., Chicago, Ill.

[22] Filed: Dec. 26, 1973

[21] Appl. No.: 428,499

[52] U.S. Cl. .................................... 427/82; 29/569
[51] Int. Cl.[2] ........................ C23C 3/02; B44D 1/18
[58] Field of Search .......... 117/201, 215; 106/47, 1, 106/48; 29/569; 357/52

[56] References Cited

UNITED STATES PATENTS

| | | | |
|---|---|---|---|
| 3,458,344 | 7/1969 | Little et al. | 106/48 |
| 3,463,646 | 8/1969 | Little et al. | 106/48 |
| 3,770,498 | 11/1973 | Flowers | 117/201 |

*Primary Examiner*—Cameron K. Weiffenbach
*Assistant Examiner*—Charles R. Wolfe, Jr.
*Attorney, Agent, or Firm*—Vincent J. Rauner; Henry T. Olsen

[57] ABSTRACT

A process for the corrosion protection of a metallized semiconductor die or wafer which includes the step of coating said die or wafer with an alcohol solution of boron, phosphorous and a metal selected from the group consisting of gold, palladium, rhodium and platinum. The solution is prepared by mixing phosphorous pentoxide in an alcohol solvent. The dissolution of the phosphorous pentoxide is exothermic and the temperature of the solution will rise during the reaction. Then boric anhydride and a salt or oxide of gold, palladium, rhodium or platinum are added to the solution. The resultant coating renders the surface of the metallization inert to ambient humidity condensation and corrosion.

4 Claims, No Drawings

SEMICONDUCTOR WAFER CORROSION PROTECTION AND SOLUTION THEREFOR

RELATED APPLICATION

This application is related to application Ser. No. 408,776 filed Oct. 23, 1973.

BACKGROUND OF THE INVENTION

This invention relates to the processing of semiconductor dies or wafers and more particularly to the stabilization, passivation or corrosion protection thereof.

The operating characteristics of a semiconductor device must remain relatively stable throughout its life. Typically, planar silicon devices have been stabilized by growing a passivating layer, such as silicon dioxide, on the surface of the body of semiconductor material, whereat the PN junctions terminate. Such passivating layers substantially improve the performance of the semiconductor device. The stability of the operating characteristics of the devices are also known to be further improved by diffusing beneficial impurities into the semiconductor material and its passivating layer.

Another form of passivation is a vapor deposited glass containing such a beneficial impurity as is disclosed in U.S. Pat. No. 3,476,619, assigned to the same assignee as herein. Such a chemically deposited glass requires processing at relatively high temperatures in controlled gaseous environments. For example, in accordance with the foregoing patent, a wafer is held at a temperature of 425°C – 450°C while a gaseous mixture containing phosphine, silane and oxygen is passed thereover.

SUMMARY OF THE INVENTION

It is an object of this invention to provide an improved process for the stabilization and corrosion protection of semiconductor dies or wafers and a solution therefor.

It is a further object of this invention to provide an improved corrosion protection process for the metallization of semiconductor dies or wafers which is performed at a low temperature under ambient conditions.

It is a further object of this invention to provide an improved process for the corrosion protection of the metallization of semiconductor dies or wafers which requires only a simple coating or plating step.

A still further object of the invention is to provide a process for the preparation of the improved corrosion protection coating solution and the coating solution per se.

In accordance with these objects, there is provided a coating solution which comprises phosphorous, boron and a metal selected from the group consisting of gold, palladium, rhodium and platinum. The improved process includes the step of coating a semiconductor die or wafer either before or after die and/or wire bonding, with the foregoing coating solution.

Further objects and advantages of the invention will be understood from the following complete description thereof.

COMPLETE DESCRIPTION

In accordance with the invention there is provided a composition and a process for corrosion protection of metallization, passivating, sealing and gettering a finished semiconductor wafer or device, before or after die attach and/or wire bonding. The composition and process may be used alone or in combination with more conventional glassed surfaces as a passivator or getter for every type of semiconductor device, particularly silicon devices. In certain cases, the composition and process may be used to recover slightly or seriously contaminated die or wafers which are nominally but imperfectly passivated. The process and composition may further be used to enhance the voltage stability in diode packages by virtue of sealing complex ohmic contacts from ambient sealing corrosion.

In accordance with the invention, the coating solution is prepared by dissolving phosphorous pentoxide ($P_2O_5$) in an appropriate solvent such as absolute methyl, ethyl or isopropyl alcohol. The solution may be stirred or the container shaken to hasten solution which is complete in a short period of time. The dissolution of the material is exothermic and the temperature of the solution will rise. Boric anhydride ($B_2O_3$) is then added to the solution and stirred or shaken. Solution will be slower than the previous dissolution of the phosphorous pentoxide, requiring several minutes for completion. It should be noted that phosphoric acid is not a substitute for phosphorous pentoxide, nor is boric acid a substitute for the boric anhydride, since with substitution of either of the foregoing materials, solution is not affected. Thus, there is a reacting interaction between the phosphorous and boron moieties as follows:

$$P_2O_5 + B_2O_3 \rightarrow -\overset{|}{\underset{|}{P}}-O-B=$$

The reaction is apparently a transanhydride or esterification type conversion.

Following dissolution of the boric anhydride, the solution may be diluted with an alcohol prior to adding an appropriate amount of a metal salt, such as gold cyanide.

In general, the solution may contain 1 to 30 grams per liter of phosphorous pentoxide, 1 to 60 grams per liter of boric anhydride and 0.005 to 10.0 grams per liter of a material such as AuCN, $PdCN_2$, $RhNO_3$ or $PtNO_3$, diluted in a solvent selected from the group consisting of methyl, ethyl, propyl, isopropyl, butyl, and isobutyl alcohol, ethylene glycol or tetrahydro furfuryl alcohol.

The foregoing solution may be placed on semiconductor wafers or dice by a spin-on or other appropriate coating process, following which the dice or wafers are finished by a bake, sinter or fusion, preferably in an atmosphere containing ammonia, the ammonia serving to apparently stabilize the solution during drying or bake, then resulting in an adherent glass-like passivating layer.

The process and solution may be used for various coating steps, either prior to or after die coat and attach, in accordance with the following specific examples.

EXAMPLE I 14.8 grams of phosphorous pentoxide was dissolved in 500 milliliters of isopropyl alcohol (reagent grade). To this solution was added 28 grams of boric anhydride, the ratio of boron to phosphorous being 3.5 to 1. Following complete dissolution of the boric anhydride, another 1000 milliliters of isopropyl alcohol was added. To 100 milliliters of this solution was added 0.2 grams of potassium gold cyanide. The solution was applied to 2500 semiconductor dice lying face up on an appropriate surface by dropping enough solution over the dice to cover them. The solution was allowed to evaporate. The dice were then baked at 200° in a forced air draft oven for three hours. They were then cooled and treated for ten minutes in concentrated ammonium hydroxide and rinsed with water and then again rinsed with methanol. The dice were then die attached and wire bonded in a conventional manner to lead frames and encapsulated by transfer molding in a conventional epoxy package. Fifty of the resulting devices were then subjected to a humidity bias temperature test (85% relative humidity, 85°C, —30V bias with no power dissipation). Fifty devices treated in a conventional manner were used as a control. In the control case, 10 percent failure was noted by devices being open-circuited at 600 hours. Those devices which were treated in accordance with the invention had only 8 percent failure mark in 1000 hours.

EXAMPLE II

Into a solution prepared as in Example I, 50 die-attached and wire bonded semiconductor dice were soaked at 23°C for 15 minutes to allow complete wetting, and physical chemisorbtion. The solution was then poured off of the semiconductor devices and the devices were air dried without rinsing, following which the devices were baked for 30 minutes at 200°C. The devices were epoxy encapsulated, utilizing 50 conventionally produced devices as a control group, both sets of devices were humidity temperature bias tested under conditions as in Example I. The 10 percent failure rate for the untreated devices was at 600 hours while only 12 percent of devices treated in accordance with the invention failed at 1000 hours.

Similar useful solutions may contain 1 to 30 grams per liter of phosphorous pentoxide, 1 to 60 grams per liter of boric anhydride, and 0.005 to 10 grams per liter of a material selected from the group consisting of platinum, palladium or rhodium salts or oxides, dissolved in a solvent selected from the group consisting of methyl, ethyl, propyl, isopropyl, butyl, and isobutyl alcohol, ethylene glycol or tetrahydro furfuryl alcohol may be used.

While the invention has been disclosed by way of certain preferred embodiments and examples thereof, it will be appreciated that suitable modifications may be made therein without departing from the spirit and scope of the invention. For example, this solution may be used for protection of bonding wires or whiskers as used in diodes.

What is claimed is:

1. In a process of manufacturing semiconductor devices which includes the steps of forming P-N junctions in a surface of a semiconductor substrate which junctions extend to the surface of said substrate and covering said junctions with a passivation layer on the surface of said substrate, the improvement which consists of the step of coating the semiconductor device with a complex containing solution consisting essentially of 1 to 30 grams per liter phosphorous pentoxide, 1 to 60 grams per liter boric anhydride, 0.005 to 10.0 grams per liter of a material selected from the group consisting of the salts and oxides of gold, platinum, palladium, and rhodium, and the balance, a solvent selected from the group consisting of methyl, ethyl, propyl, isopropyl, butyl, and isobutyl alcohol, ethylene glycol, and tetrahydro furfuryl alcohol.

2. In a process as recited in claim 1 wherein said coating step includes immersing the semiconductor device in said complex solution and drying the device in an atmosphere containing ammonia.

3. In a process as recited in claim 1 wherein said coating step includes covering the surface of said semiconductor device with said complex solution, drying said device, and rinsing the surface of said device with concentrated ammonium hydroxide.

4. In a process as recited in claim 3 wherein the temperature of drying is approximately 200°C.

* * * * *